United States Patent
Zhang

(10) Patent No.: US 11,450,361 B2
(45) Date of Patent: *Sep. 20, 2022

(54) INTEGRATED CIRCUIT STRUCTURE AND MEMORY

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/243,461

(22) Filed: Apr. 28, 2021

(65) Prior Publication Data
US 2021/0249056 A1  Aug. 12, 2021

Related U.S. Application Data

(63) Continuation of application No. PCT/CN2020/099980, filed on Jul. 2, 2020.

(30) Foreign Application Priority Data

Jan. 14, 2020  (CN) .......................... 202010036731.7
Jan. 14, 2020  (CN) .......................... 202020081378.X

(51) Int. Cl.
*G11C 7/10* (2006.01)
*G11C 5/06* (2006.01)

(52) U.S. Cl.
CPC .............. *G11C 7/1096* (2013.01); *G11C 5/06* (2013.01)

(58) Field of Classification Search
CPC ... G11C 7/1096; G11C 5/06; G11C 2207/105; G11C 2207/104
See application file for complete search history.

(56) References Cited

U.S. PATENT DOCUMENTS

2006/0233012 A1 * 10/2006 Sekiguchi ................ G11C 5/02
                                                              365/51
2007/0162685 A1 * 7/2007 Suh ...................... G11C 11/4096
                                                              711/100

(Continued)

FOREIGN PATENT DOCUMENTS

CN         105659219 A     6/2016
CN         108417231 A     8/2018

(Continued)

*Primary Examiner* — Han Yang
(74) *Attorney, Agent, or Firm* — Kilpatrick Townsend & Stockton LLP

(57) ABSTRACT

Embodiments provide an integrated circuit structure and a memory, and relate to the field of semiconductor memory technologies. The integrated circuit structure includes: a pad region including a plurality of signal pads arranged along a target direction; and a first circuit region arranged on one side of the pad region. The first circuit region includes a plurality of signal input circuit modules arranged along the target direction and correspondingly connected to the plurality of signal pads respectively. Each of the plurality of signal input circuit modules is configured to implement a sampling operation of an input signal and write a sampling result into a storage array. A size of the first circuit region along the target direction is smaller than that of the pad region along the target direction. According to the embodiments, the performance of a write operation can be improved for the memory.

9 Claims, 3 Drawing Sheets

Path corresponding to tDQS2DQ

(56) References Cited

U.S. PATENT DOCUMENTS

| | | | | |
|---|---|---|---|---|
| 2013/0141994 A1* | 6/2013 | Ito | ............................ | G11C 7/222 |
| | | | | 365/193 |
| 2013/0313393 A1 | 11/2013 | Wade et al. | | |
| 2015/0106538 A1 | 4/2015 | Vasudevan et al. | | |
| 2018/0130739 A1* | 5/2018 | Miura | ...................... | H01L 24/02 |

FOREIGN PATENT DOCUMENTS

| | | |
|---|---|---|
| CN | 210805229 U | 6/2020 |
| CN | 210805230 U | 6/2020 |

\* cited by examiner

INTEGRATED CIRCUIT STRUCTURE AND MEMORY

CROSS REFERENCE

This application is a continuation of PCT/CN2020/099980, filed on Jul. 2, 2020, which claims priority to Chinese Patent Application No. 202010036731.7, titled "INTEGRATED CIRCUIT STRUCTURE AND MEMORY", and Chinese Patent Application No. 202020081378.X, titled "INTEGRATED CIRCUIT STRUCTURE AND MEMORY" filed on Jan. 14, 2020, the entire contents of which are incorporated herein by reference.

TECHNICAL FIELD

The present disclosure relates to the field of semiconductor memory technologies, and more particularly, to an integrated circuit structure and a memory.

BACKGROUND

With the development of memory technologies, Double Data Rate Fourth Synchronous Dynamic Random Access Memory (DDR4 SDRAM) emerges as the times require. The DDR4 SDRAM has a lower power supply voltage and a higher transmission rate, and a bank group thereon has the characteristics of independently starting operations such as read and write operations. In addition, compared to memories such as DDR3/DDR2, the DDR4 SDRAM not only has fast and power-saving characteristics, but also can enhance signal integrity and improve the reliability of data transmission and storage.

Taking a low-power memory chip LPDDR4 as an example, in the write operation, a data strobe signal (DQS) and a data signal (DQ) are transmitted to the LPDDR4 at an approximately equal speed through a transmission path having an approximately equal length. In the LPDDR4, a DQS input circuit module transmits the received DQS signal as a strobe sample to a DQ input circuit module to collect data. It takes a while to transmit the DQS signal to the DQ input circuit module, which causes the DQS signal to be out of sync with the DQ signal.

To compensate for the time difference between the DQS signal and the DQ signal, the DQS signal may be transmitted in advance. For this reason, in JEDEC standards, a parameter tDQS2DQ is defined to represent the time of advance transmission.

However, the tDQS2DQ tends to be a large value and is susceptible to temperature and voltage interferences on the transmission path, which has a negative effect on the performance of the memory.

SUMMARY

An objective of the present disclosure is to provide an integrated circuit structure and a memory to overcome, at least to a certain extent, the problems of larger tDQS2DQ value and temperature and voltage interferences on a transmission path caused by limitations and defects of related technologies.

According to a first aspect of the present disclosure, there is provided an integrated circuit structure, comprising:
a pad region including a plurality of signal pads arranged along a target direction; and
a first circuit region arranged on one side of the pad region, the first circuit region comprising a plurality of signal input circuit modules arranged along the target direction and correspondingly connected to the plurality of signal pads respectively, wherein each of the plurality of signal input circuit modules is configured to implement a sampling operation of an input signal and write a sampling result into a storage array.

A size of the first circuit region along the target direction is smaller than that of the pad region along the target direction.

In some embodiments, the plurality of signal pads comprise:
a first differential data strobe pad, a second differential data strobe pad, a data mask pad, and a plurality of data input/output pads.

In some embodiments, the pad region further comprises:
a plurality of power source pads and a plurality of ground pads.

In some embodiments, the pad region comprises:
a first pad subregion and a second pad subregion, wherein the first pad subregion and the second pad subregion comprising an equal number of data input/output pads, and the number is half of the total number of data input/output pads.

The first differential data strobe pad, the second differential data strobe pad and the data mask pad are arranged between the first pad subregion and the second pad subregion.

In some embodiments, the plurality of signal input circuit modules comprise:
a data strobe circuit module, a data mask circuit module, and a plurality of data input circuit modules.

In some embodiments, the first circuit region comprises:
a first circuit subregion and a second circuit subregion, wherein the first circuit subregion and the second circuit subregion include an equal number of data input circuit modules, and the number is half of the total number of data input circuit modules.

The data strobe circuit module and the data mask circuit module are arranged between the first circuit subregion and the second circuit subregion.

In some embodiments, the data strobe circuit module is connected to the first differential data strobe pad and the second differential data strobe pad, respectively.

In some embodiments, a distance between the adjacent signal input circuit modules is less than a distance threshold.

The distance threshold is determined based on the size of the pad region along the target direction and the size of each of the plurality of signal input circuit modules along the target direction.

In some embodiments, the integrated circuit structure also comprises:
a second circuit region arranged on the same side of the pad region with respect to the first circuit region, wherein the second circuit region includes a plurality of signal output circuit modules arranged along the target direction and correspondingly connected to the plurality of signal pads respectively, and each of the plurality of signal output circuit modules is configured to read data stored in the storage array.

According to a second aspect of the present disclosure, there is provided a memory, which includes the integrated circuit structure according to any one of the above embodiments.

In the technical solutions provided by some embodiments of the present disclosure, the size of the first circuit region along the target direction is designed to be less than that of the pad region along the target direction. Compared with the existing technologies, in one aspect, a length of a path for transmitting a DQS signal to a DQ input circuit module is reduced, and thus the tDQS2DQ is reduced. In another aspect, a shorter path can alleviate the temperature and voltage interferences, which can greatly improve temperature and voltage performances and can reduce current consumption, helping to ensure signal integrity and improve memory performance.

It is to be understood that the above general description and the detailed description below are merely exemplary and explanatory, and do not limit the present disclosure.

BRIEF DESCRIPTION OF THE DRAWINGS

The accompanying drawings herein are incorporated in and constitute a part of this specification, illustrate embodiments conforming to the present disclosure and, together with the description, serve to explain the principles of the present disclosure. Apparently, the accompanying drawings in the following description show merely some embodiments of the present disclosure, and persons of ordinary skill in the art may still derive other drawings from these accompanying drawings without creative efforts. In the drawings.

DETAILED DESCRIPTION

Figure 1:
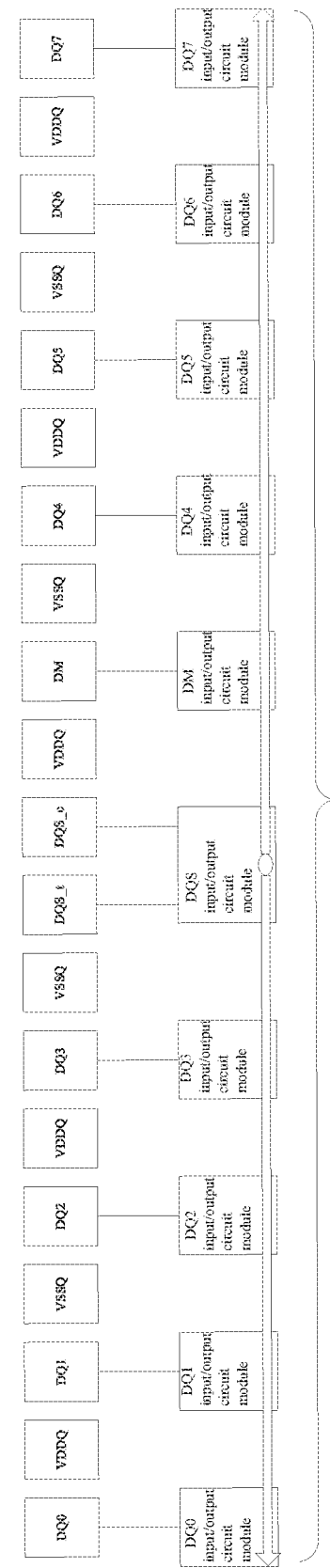
FIG. 1 illustrates a schematic diagram of an integrated circuit structure in some technologies.

Exemplary embodiments will be described more comprehensively by referring to the accompanying drawings now. However, the exemplary embodiments can be embodied in many forms and should not be construed as limited to the embodiments set forth herein; rather, these embodiments are provided so that the present disclosure will be made thorough and complete, and the concept of exemplary embodiments will be fully conveyed to those skilled in the art. Furthermore, the described features, structures, or characteristics may be combined in any suitable manner in one or more embodiments. In the following description, numerous details are provided to provide a thorough understanding of the embodiments of the present disclosure. Those skilled in the art will recognize, however, that the technical solution of the present disclosure may be practiced without one or more of the details described, or that other methods, components, devices, steps and so on may be employed. In other instances, well-known technical solutions are not shown or described in detail to avoid obscuring aspects of the present disclosure.

In addition, the accompanying drawings are merely exemplary illustration of the present disclosure, and are not necessarily drawn to scale. The same reference numerals in the drawings denote the same or similar parts, and thus repeated description thereof will be omitted.

In the process of executing a write operation by a memory such as LPDDR4, a DQ input circuit module may obtain a signal transmitted by a Data Queue (DQ) port, and this signal generally is a signal that cannot be directly processed by a digital circuit due to parasitic effects and various interferences. In this case, the DQ input circuit module needs to sample the obtained DQ signal by means of a DQS signal, and the DQ input circuit module writes results obtained by sampling into a storage array.

The DQS signal and the DQ signal almost take the same time to reach the LPDDR4, and inside the LPDDR4, it takes a while for the DQS signal to be transmitted to the DQ input circuit module, which causes the DQS signal to be out of sync with the DQ signal. To avoid this situation, a semiconductor memory chip may transmit the DQS signal to the LPDDR4 one tDQS2DQ in advance, such that the DQS signal and the DQ signal can reach the DQ input circuit module synchronously, to improve the accuracy of sampling the DQ signal by the DQ input circuit module.

However, the tDQS2DQ is susceptible to factors such as internal operating voltage or operating temperature of the LPDDR4. To solve this problem, the tDQS2DQ needs to be adjusted by continuously detecting variations of parameters such as the internal operating voltage and the operating temperature. However, the detection process consumes time and energy, which results in slower write speed, thus having a negative effect on the working performance of the memory.

FIG. 1 illustrates a schematic diagram of an integrated circuit structure in some technologies. In these technologies, a DQ input/output circuit module and a signal pad are manufactured and configured together, such that a path for the obtained DQS signal to reach the DQ input/output circuit module at two ends is longer, which is approximate to the length of a region occupied by the signal pad. In the case where the DQ includes 8 bits in total from DQ0 to DQ7, if a corresponding signal pad pitch is 60 μm, the sum of the paths for the DQS signal to reach DQ0 and DQ7 input/output circuit modules is about 1,140 μm. In the exemplary embodiments of the present disclosure, the sum of the paths is denoted as the path corresponding to the tDQS2DQ.

In view of this, if the path corresponding to the tDQS2DQ is shortened, the effects of the factors such as the operating voltage and the operating temperature on the tDQS2DQ are also reduced. In addition, the shortening of the path can also reduce current consumption and help to ensure signal integrity. Thus, the write performance of the memory can be improved.

An integrated circuit structure in one exemplary embodiment of the present disclosure will be described below with reference to FIG. 2.

Figure 2:
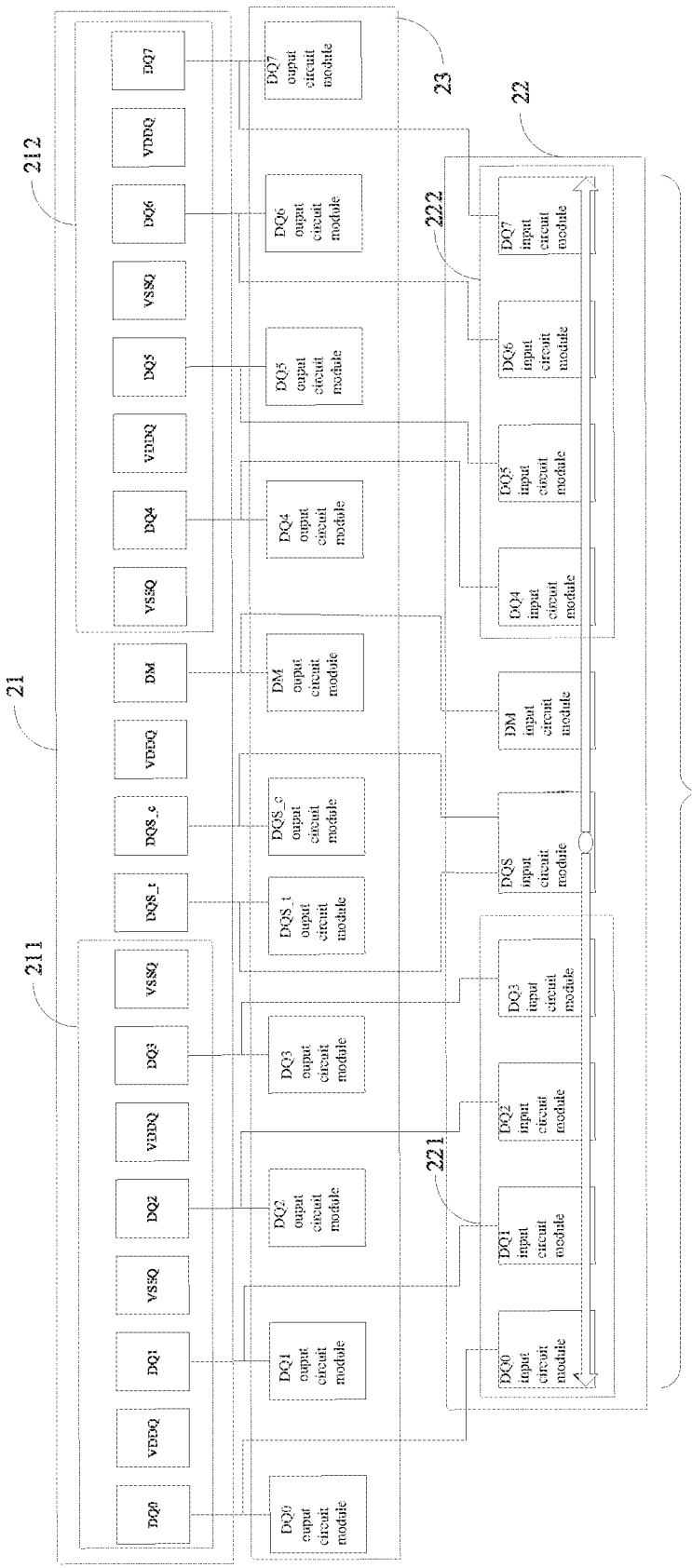
FIG. 2 illustrates a schematic diagram of an integrated circuit structure according to an exemplary embodiment of the present disclosure.

With reference to FIG. 2, the integrated circuit structure may include a pad region 21 and a first circuit region 22.

The pad region 21 includes a plurality of signal pads arranged along a target direction, wherein the signal pad refers to a pad corresponding to each data signal port. The signal pad may include but is not limited to a plurality of data input/output pads, a first differential data strobe pad, a second differential data strobe pad, and a data mask pad.

For the plurality of data input/output pads, taking the DQ including 8 bits from DQ0 to DQ7 in total as an example, the plurality of data input/output pads include a DQ0 pad, a DQ1 pad, a DQ2 pad, a DQ3 pad, a DQ4 pad, a DQ5 pad, a DQ6 pad, and a DQ7 pad. However, it is to be understood that the plurality of data input/output pads may also include a total of 16 pads from DQ0 to DQ15, depending on different types of memories, which is not limited in the present disclosure.

The data input/output pad executes the write operation and the read operation synchronously. In the process of executing the write operation, the data input/output pad receives a data signal from a pin through a lead, and transmits the data signal to a corresponding circuit module. In the process of executing the read operation, the data input/output pad receives the data signal from the corresponding circuit module and transmits this signal through the pin.

In a memory above DDR4, a differential data strobe pad may include a first differential data strobe pad (denoted as DQS_t pad) and a second differential data strobe pad (denoted as DQS_c pad). A signal received by the first differential data strobe pad and a signal received by the second differential data strobe pad have the same amplitude and opposite phases. In the process of sampling using a differential signal, a time point at which two differential signals cross may be, for example, a time point of sampling, and the data signal is sampled based on this time point of sampling.

For the data mask pad (DM pad), a mask signal for executing partial write functions may be inputted. When the received mask signal is at a low level, the bit corresponding to the input data will be discarded.

In addition, the pad region 21 may also include a plurality of power source pads (VDDQ pads) and a plurality of ground pads (VSSQ pads) to provide power source and ground terminals.

According to one embodiment of the present disclosure, the pad region 21 may include a first pad subregion 211 and a second pad subregion 212. The number of data input/output pads contained in the first pad subregion 211 is equal to that of data input/output pads contained in the second pad subregion 212, and the number is half of the total number of the data input/output pads. For example, the first pad subregion 211 includes a DQ0 pad, a DQ1 pad, a DQ2 pad, and a DQ3 pad; and the second pad subregion 212 includes a DQ4 pad, a DQ5 pad, a DQ6 pad, and a DQ7 pad.

In this case, the first differential data strobe pad, the second differential data strobe pad and the data mask pad may be arranged between the first pad subregion 211 and the second pad subregion 212, making it easier for a differential data strobe signal to perform path matching on each DQ input circuit module, thereby avoiding the problem of excessive distance difference.

It is to be understood that according to some other embodiments of the present disclosure, any one of the first differential data strobe pad, the second differential data strobe pad and the data mask pad may be arranged on one side of the pad region 21, and their positions with respect to each data input/output pad is not limited.

The first circuit region 22 is arranged on one side of the pad region 21. That is, the first circuit region 22 and the pad region 21 are two regions without overlapped regions. Corresponding to the plurality of signal pads in the pad region 21, the first circuit region 22 includes a plurality of signal input circuit modules arranged along a target direction, and each of the plurality of signal input circuit modules is connected to a corresponding signal pad through a metal wire. Each of the plurality of signal input circuit modules is configured to implement a sampling operation of an input signal and write a sampling result into a storage array.

The plurality of signal input circuit modules may include a plurality of data input circuit modules, a plurality of data strobe circuit modules, and a plurality of data mask circuit modules.

For the plurality of data input circuit modules, corresponding to the plurality of data input/output pads described above, the plurality of data input circuit modules may include a DQ0 input circuit module, a DQ1 input circuit module, a DQ2 input circuit module, a DQ3 input circuit module, a DQ4 input circuit module, a DQ5 input circuit module, a DQ6 input circuit module, and a DQ7 input circuit module.

Each of the plurality of DQ input circuit modules is configured to receive a data signal transmitted by the corresponding DQ pad and sample the data signal in response to a data strobe signal to write the sampling result into the storage array.

Also be referred to as a data strobe input circuit module in the embodiments of the present disclosure, the data strobe circuit module is configured to transmit the data strobe signal to each of the plurality of DQ input circuit modules.

The data mask circuit module is configured to obtain mask information and execute corresponding partial write operations.

According to one embodiment of the present disclosure, the first circuit region 22 includes a first circuit subregion 221 and a second circuit subregion 222. The number of data input circuit modules contained in the first circuit subregion 221 is equal to that of data input circuit modules contained in the second circuit subregion 222, and the number is half of the total number of the data input circuit modules. For example, the first circuit subregion 221 includes a DQ0 input circuit module, a DQ1 input circuit module, a DQ2 input circuit module, and a DQ3 input circuit module. The second circuit subregion 222 includes a DQ4 input circuit module, a DQ5 input circuit module, a DQ6 input circuit module, and a DQ7 input circuit module.

In this case, the data strobe circuit module and the data mask circuit module are arranged between the first circuit subregion 221 and the second circuit subregion 222.

In addition, with reference to FIG. 2, the data strobe circuit module may be connected to the first differential data strobe pad and the second differential data strobe pad through metal wires.

In the exemplary embodiments of the present disclosure, a size of the first circuit region 22 along a target direction is smaller than that of the pad region 21 along the target direction. As mentioned above, the size of the first circuit region 22 along the target direction refers to the length of the first circuit region 22 along a direction in which a plurality of signal input circuit modules are arranged, i.e., a length of a path corresponding to the tDQS2DQ.

The size of the first circuit region 22 along the target direction is designed to be less than that of the pad region 21 along the target direction. In one aspect, the length of the path for transmitting the DQS signal to the DQ input circuit module is reduced, and thus the tDQS2DQ is reduced. In another aspect, a shorter path can alleviate the temperature and voltage interferences, which can greatly improve temperature and voltage performances and can reduce current consumption, helping to ensure signal integrity and improve memory performance.

According to some embodiments of the present disclosure, in the first circuit region 22, a distance between the adjacent signal input circuit modules is smaller than a distance threshold. The distance threshold may be determined based on the size of the pad region 21 along the target direction and the size of each of the plurality of signal input circuit modules along the target direction, such that the size of the first circuit region 22 along the target direction is smaller than that of the pad region 21 along the target direction. It is to be noted that distances between the adjacent signal input circuit modules may be the same or may be different.

As shown in FIG. 2, there may be gaps between the adjacent signal input circuit modules to avoid mutual interference between these modules.

In addition, the integrated circuit structure in the exemplary embodiments of the present disclosure further includes a second circuit region 23.

The second circuit region 23 may be arranged on the same side of the pad region 21 with respect to the first circuit region 22. That is, with respect to the pad region 21, the first circuit region 22 and the second circuit region 23 are arranged on the same side.

The second circuit region 23 may include a plurality of signal output circuit modules arranged along the target direction. Each of the plurality of signal output circuit modules is connected to the corresponding one of the plurality of signal pads through metal wires, and each of the plurality of signal output circuit modules is configured to read data stored in the storage array.

In addition, the size of the first circuit region along the target direction may be set smaller.

Figure 3:
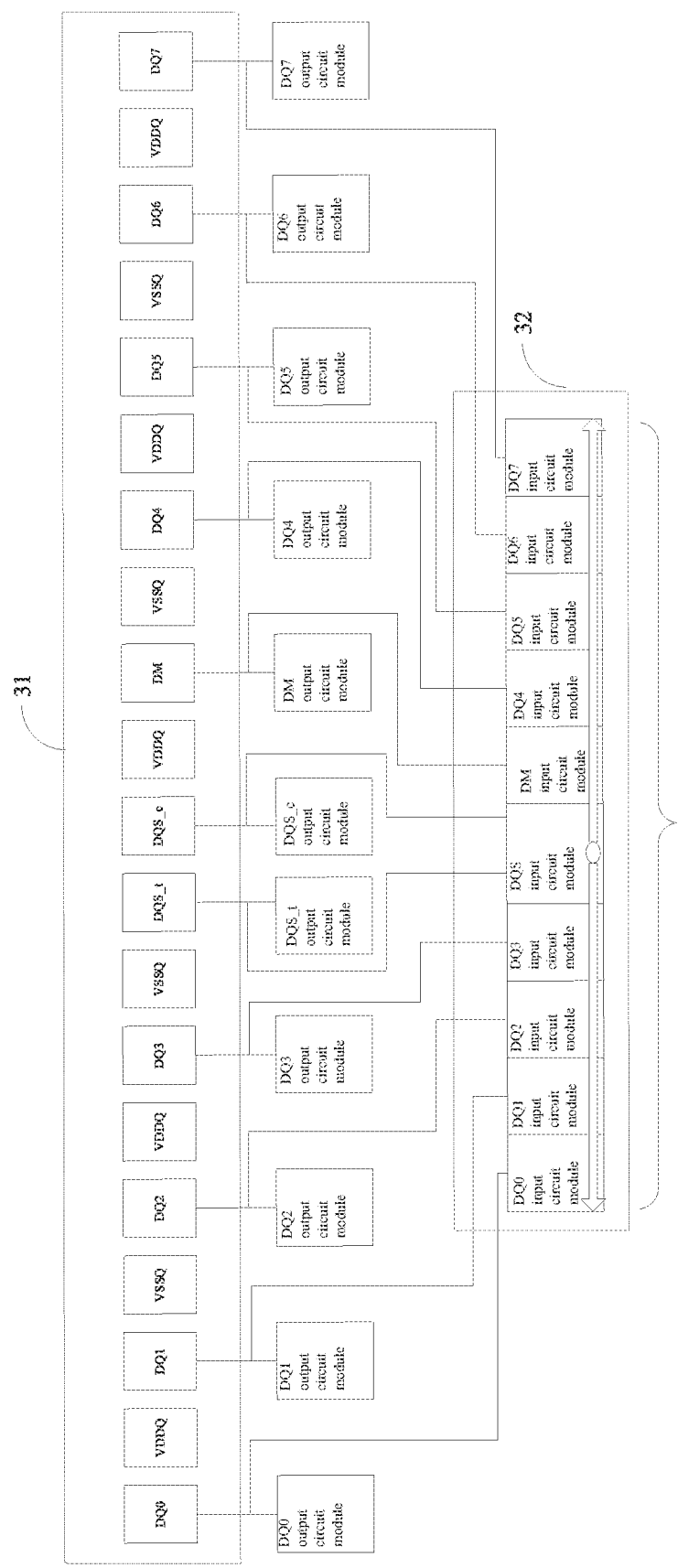
FIG. 3 illustrates a schematic diagram of an integrated circuit structure according to another exemplary embodiment of the present disclosure.

Referring to FIG. 3, the pad region 31 is the same as the pad region 21 in FIG. 2, and thus is not to be described again. For the first circuit region 32, the distances between the adjacent signal input circuit modules may be as small as possible. That is, the above-mentioned distance threshold may be configured as small as possible. In adjacent structures configured as shown in FIG. 3, the length of the path corresponding to the tDQS2DQ is further shortened, and thus more space may be saved in the fabrication processes.

As far as the exemplary structures as shown in FIG. 3 is concerned, the path corresponding to the tDQS2DQ is merely about 200 μm because each of the plurality of signal input circuit modules has a smaller area. Compared with the 1,140 μm in some technologies in FIG. 1, the length of the path is greatly reduced.

In addition, with reference to FIG. 2 or FIG. 3, in the embodiments of the present disclosure, the metal wires from the plurality of pads to the plurality of signal input circuit modules may be configured to be narrow, and thus a large current drive is not required, and input capacitance can be reduced.

The present disclosure also provides a memory, which includes any one of the above-mentioned integrated circuit structures.

It is to be understood that the present disclosure does not limit the type of the memory, which may be a DDR4 SDRAM such as an LPDDR4, or may be a DDR5 memory, etc.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. An integrated circuit structure, comprising:
   a pad region comprising a plurality of signal pads arranged along a target direction; and
   a first circuit region arranged on one side of the pad region, the first circuit region comprising a plurality of signal input circuit modules arranged along the target direction and correspondingly connected to the plurality of signal pads respectively, each of the plurality of signal input circuit modules being configured to implement a sampling operation of an input signal and write a sampling result into a storage array; and, wherein
   a size of the first circuit region along the target direction is smaller than that of the pad region along the target direction; and
   a distance between adjacent signal input circuit modules is less than a distance threshold, the distance threshold being determined based on the size of the pad region along the target direction and size of each of the plurality of signal input circuit modules along the target direction.

2. The integrated circuit structure according to claim 1, wherein each of the plurality of signal pads comprise:
   a first differential data strobe pad, a second differential data strobe pad, a data mask pad, and a plurality of data input/output pads.

3. The integrated circuit structure according to claim 2, wherein the pad region further comprises:
   a plurality of power source pads and a plurality of ground pads.

4. The integrated circuit structure according to claim 2, wherein the pad region comprises:
   a first pad subregion and a second pad subregion, the first pad subregion and the second pad subregion comprising an equal number of data input/output pads, and the number being half of the total number of data input/output pads;
   wherein the first differential data strobe pad, the second differential data strobe pad and the data mask pad are arranged between the first pad subregion and the second pad subregion.

5. The integrated circuit structure according to claim 4, wherein each of the plurality of signal input circuit modules comprise:
   a data strobe circuit module, a data mask circuit module, and a plurality of data input circuit modules.

6. The integrated circuit structure according to claim 5, wherein the first circuit region comprises:
   a first circuit subregion and a second circuit subregion, the first circuit subregion and the second circuit subregion comprising an equal number of data input circuit modules, and the number being half of the total number of data input circuit modules;
   wherein the data strobe circuit module and the data mask circuit module are arranged between the first circuit subregion and the second circuit subregion.

7. The integrated circuit structure according to claim 5, wherein the data strobe circuit module is connected to the first differential data strobe pad and the second differential data strobe pad, respectively.

8. The integrated circuit structure according to claim 1, further comprising:
   a second circuit region arranged on same side of the pad region with respect to the first circuit region, the second circuit region comprising a plurality of signal output circuit modules arranged along the target direction and correspondingly connected to the plurality of signal pads respectively, each of the plurality of signal output circuit modules being configured to read data stored in the storage array.

9. A memory, comprising an integrated circuit structure, wherein the integrated circuit structure comprising:
- a pad region comprising a plurality of signal pads arranged along a target direction; and
- a first circuit region arranged on one side of the pad region, the first circuit region comprising a plurality of signal input circuit modules arranged along the target direction and correspondingly connected to the plurality of signal pads respectively, each of the plurality of signal input circuit modules being configured to implement a sampling operation of an input signal and write a sampling result into a storage array;
- wherein a size of the first circuit region along the target direction is smaller than that of the pad region along the target direction, and
- a distance between adjacent signal input circuit modules is less than a distance threshold, the distance threshold being determined based on the size of the pad region along the target direction and size of each of the plurality of signal input circuit modules along the target direction.

* * * * *